US012707859B2

(12) United States Patent
Kim et al.

(10) Patent No.: US 12,707,859 B2
(45) Date of Patent: Aug. 11, 2026

(54) DISPLAY DEVICE

(71) Applicant: Samsung Display Co., Ltd., Yongin-si (KR)

(72) Inventors: Wooyoung Kim, Yongin-si (KR); Hyeoji Kang, Seoul (KR); Ohjeong Kwon, Hwaseong-si (KR); Kyeongjong Kim, Suwon-si (KR); Taeho Kim, Yongin-si (KR); Hongyeon Lee, Suwon-si (KR); Seungyeon Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 935 days.

(21) Appl. No.: 17/872,972

(22) Filed: Jul. 25, 2022

(65) Prior Publication Data

US 2023/0069748 A1 Mar. 2, 2023

(30) Foreign Application Priority Data

Aug. 25, 2021 (KR) ........................ 10-2021-0112664

(51) Int. Cl.
*H10W 10/00* (2026.01)
*H10K 59/122* (2023.01)
(Continued)

(52) U.S. Cl.
CPC ......... *H10K 59/873* (2023.02); *H10K 59/122* (2023.02); *H10K 59/352* (2023.02);
(Continued)

(58) Field of Classification Search
CPC .... H10K 59/40; H10K 59/353; H10K 59/122; H10K 59/38; H10K 50/865; H10K 59/352; H10K 50/844
See application file for complete search history.

(56) References Cited

U.S. PATENT DOCUMENTS 8,415,872 B2 4/2013 Choi et al.
10,586,949 B2 3/2020 Kwak
(Continued)

FOREIGN PATENT DOCUMENTS

KR 10-2017-0015827 A 2/2017
KR 10-2019-0069166 A 6/2019
(Continued)

OTHER PUBLICATIONS

Arun K. Singh, et al., “Adhesion of Microchannel-Based Complementary Surfaces”, Department of Chemical Engineering and §Bioengineering Program, Lehigh University, Bethlehem, Pennsylvania, US 18015 and Field of Theoretical & Applied Mechanics, Cornell University, Ithaca, New York, US 14853, dx.doi.org/10.1021/la204519w, Langmuir 2012, 28, 4213-4222.

*Primary Examiner* — Mohammad M Choudhry
(74) *Attorney, Agent, or Firm* — Womble Bond Dickinson (US) LLP

(57) ABSTRACT

A display device includes: a display panel comprising light emitting areas and a non-light-emitting area adjacent to the light emitting areas; an input sensor on the display panel; and a reflective control layer on the input sensor, the display panel including: a light emitting element; a capping layer on the light emitting element; a pattern layer directly on the capping layer and comprising a plurality of protrusions spaced apart from each other; and an encapsulation layer on the pattern layer, wherein each of the protrusions does not overlap the light emitting areas and overlaps the non-light-emitting area.

20 Claims, 7 Drawing Sheets

(51) Int. Cl.

| | |
|---|---|
| ***H10K 59/35*** | (2023.01) |
| ***H10K 59/38*** | (2023.01) |
| ***H10K 59/40*** | (2023.01) |
| ***H10K 59/80*** | (2023.01) |

(52) U.S. Cl.

CPC ........... *H10K 59/353* (2023.02); *H10K 59/38* (2023.02); *H10K 59/40* (2023.02); *H10K 59/8792* (2023.02)

(56) References Cited

U.S. PATENT DOCUMENTS

| | | | | |
|---|---|---|---|---|
| 10,978,518 | B2 | 4/2021 | Ahn et al. | |
| 2013/0161680 | A1* | 6/2013 | Oh | H10K 50/8445 438/46 |
| 2018/0026082 | A1* | 1/2018 | Lee | G02F 1/133528 349/96 |
| 2018/0088713 | A1* | 3/2018 | Yang | G06F 3/0443 |
| 2019/0148467 | A1* | 5/2019 | Chung | H10K 59/879 257/40 |
| 2019/0206952 | A1* | 7/2019 | Lee | H10K 59/88 |
| 2020/0091464 | A1* | 3/2020 | Park | H10K 59/32 |
| 2020/0266371 | A1* | 8/2020 | Ju | H10K 59/38 |

FOREIGN PATENT DOCUMENTS

| | | | |
|---|---|---|---|
| KR | 10-2019-0081061 | A | 7/2019 |
| KR | 10-2020-0084969 | A | 7/2020 |
| KR | 10-2021-0014244 | A | 2/2021 |
| KR | 10-2021-0021505 | A | 2/2021 |

* cited by examiner

DISPLAY DEVICE

CROSS-REFERENCE TO RELATED APPLICATION

The present application claims priority to and the benefit of Korean Patent Application No. 10-2021-0112664, filed on Aug. 25, 2021, the entire content of which is hereby incorporated by reference.

BACKGROUND

1. Field

Aspects of some embodiments of the present disclosure relate to a display device.

2. Description of the Related Art

Display devices applied to multimedia devices, such as televisions, mobile phones, tablet computers, navigation units, game units, or the like, are becoming more ubiquitous in the modern age. When external light is incident into the display device, the external light may be reflected by electrodes in the display panel, and as a result, the display quality of the display device may be degraded or deteriorated.

A display device may include a polarizing plate to reduce a reflectance of the display device with respect to the external light. However, the polarizing plate may cause deterioration of brightness of images. Accordingly, a technology for an anti-reflection component or member to replace the polarizing plate is being developed.

The above information disclosed in this Background section is only for enhancement of understanding of the background and therefore the information discussed in this Background section does not necessarily constitute prior art.

SUMMARY

Aspects of some embodiments of the present disclosure relate to a display device. For example, some embodiments of the present disclosure relate to a display device including a display panel in which mechanical adhesion of members or components thereof is relatively improved.

Aspects of some embodiments of the present disclosure include a display device including an inorganic pattern layer as an anti-reflective member for its display panel and having improved adhesion between the inorganic pattern layer and members thereof.

According to some embodiments of the present disclosure, a display device includes a display panel including light emitting areas and a non-light-emitting area adjacent to the light emitting areas, an input sensor on the display panel, and a reflective control layer on the input sensor. The display panel includes a light emitting element, a capping layer on the light emitting element, a pattern layer directly on the capping layer and including a plurality of protrusions spaced apart from each other, and an encapsulation layer on the pattern layer. Each of the protrusions does not overlap the light emitting areas and overlaps the non-light-emitting area.

According to some embodiments, the encapsulation layer includes a first inorganic layer, an organic layer on the first inorganic layer, and a second inorganic layer on the organic layer, and the first inorganic layer is filled in between the protrusions.

According to some embodiments, the first inorganic layer is directly on the capping layer between the protrusions.

According to some embodiments, the light emitting areas are adjacent to each other in a first direction and a second direction perpendicular to the first direction, and each of the protrusions overlaps the non-light-emitting area between the light emitting areas.

According to some embodiments, each of the protrusions is spaced apart from the light emitting areas adjacent thereto when viewed in a plane substantially parallel to the capping layer (or in a plan view).

According to some embodiments, the light emitting areas include a first light emitting group including a first color light emitting area and a third color emitting area alternately arranged with the first color light emitting area in a first direction and a second light emitting group spaced apart from the first light emitting group in a second direction different from the first direction and including second color light emitting areas arranged in the first direction. Each of the protrusions overlaps the non-light-emitting area between the first color light emitting area and the third color light emitting area adjacent to the first color light emitting area and the non-light-emitting area between the second color light emitting areas.

According to some embodiments, each of the second color light emitting areas is arranged along a direction between the first direction and the second direction substantially perpendicular to the first direction to be spaced apart from the first color light emitting area and the third color light emitting area.

According to some embodiments, each of the protrusions has a thickness from about 80 angstroms to about 100 angstroms.

According to some embodiments, the pattern layer includes at least one of Ag, Mg, Mn, Bi, Yb, Zn, Te, or Se.

According to some embodiments, each of the protrusions has a quadrangular shape in which at least one side has a length from about 10 micrometers to about 15 micrometers.

According to some embodiments, the reflective control layer includes first and second color filters transmitting lights in different wavelength ranges and a light blocking pattern overlapping edges of the first and second color filters, and the protrusions overlap the light blocking pattern.

According to some embodiments, the display panel includes a pixel definition layer through which a plurality of openings is defined, the openings correspond to the light emitting areas, respectively, and the protrusions are on the pixel definition layer.

According to some embodiments, the light emitting element includes a first electrode, a second electrode facing the first electrode, and a light emitting layer between the first electrode and the second electrode, and the light emitting layer overlaps the light emitting areas.

According to some embodiments, the protrusions do not overlap the light emitting layer.

According to some embodiments, the capping layer is a common layer that overlaps the light emitting areas and the non-light-emitting area.

According to some embodiments of the present disclosure, a display device includes a display panel including light emitting areas and a non-light-emitting area adjacent to the light emitting areas, an input sensor on the display panel, and a reflective control layer on the input sensor. The display panel includes a light emitting element, a capping layer on the light emitting element, a pattern layer including a base portion directly on the capping layer and a plurality of protrusions protruding from the base portion, and an encapsulation layer on the pattern layer. The base portion entirely overlaps the light emitting areas and the non-light-emitting area, and each of the protrusions does not overlap the light emitting areas and overlaps the non-light-emitting area.

According to some embodiments, the encapsulation layer includes a first inorganic layer, an organic layer on the first inorganic layer, and a second inorganic layer on the organic layer, and the first inorganic layer is filled in between the protrusions.

According to some embodiments, the first inorganic layer is directly on the base portion between the protrusions.

According to some embodiments, the light emitting areas are adjacent to each other in a first direction and a second direction substantially perpendicular to the first direction, and each of the protrusions overlaps the non-light-emitting area between the light emitting areas.

According to some embodiments, each of the protrusions is spaced apart from the light emitting areas adjacent thereto when viewed in a plane substantially parallel to the capping layer (or in a plan view).

Thus, according to some embodiments of the present disclosure, because a display device includes a pattern layer between the capping layer and an encapsulation layer of the display panel, the contact area between the pattern layer and the encapsulation layer may increase, and thus, the adhesion force between the pattern layer and the encapsulation layer may increase.

In addition, as the adhesion force between members included in the display panel increases, the reliability of the display device may be improved.

BRIEF DESCRIPTION OF THE DRAWINGS

The above and other characteristics of embodiments according to the present disclosure will become readily apparent by reference to the following detailed description when considered in conjunction with the accompanying drawings wherein:

FIG. 5A is a cross-sectional view showing a display device according to some embodiments of the present disclosure; and FIG. 5B is a cross-sectional view showing a display device according to some embodiments of the present disclosure.

DETAILED DESCRIPTION

Figure 1:
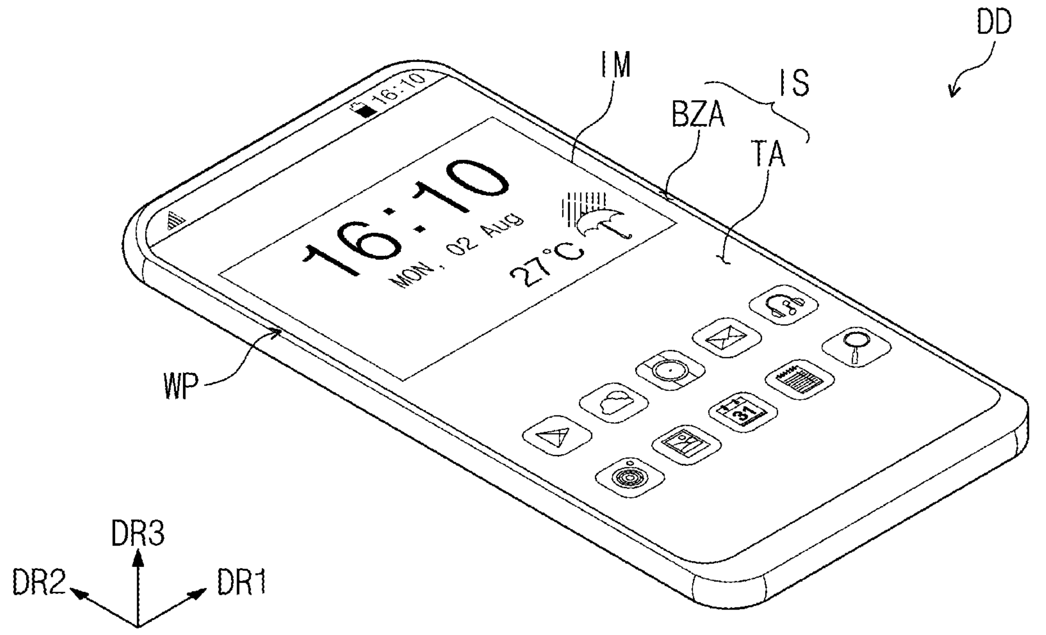
FIG. 1 is a perspective view showing a display device according to some embodiments of the present disclosure.

Embodiments according to the present disclosure may be variously modified and realized in many different forms, and thus aspects of some embodiments will be illustrated in the drawings and described in more detail hereinbelow. However, embodiments according to the present disclosure should not be limited to the specific disclosed forms, and be construed to include all modifications, equivalents, or replacements included in the spirit and scope of embodiments according to the present disclosure.

It will be understood that when an element (or area, layer, or portion) is referred to as being “on”, “connected to” or “coupled to” another element or layer, it can be directly on, connected or coupled to the other element or layer or intervening elements or layers may be present.

Meanwhile, in the present disclosure, the expression “directly arranged” or “directly located” or “directly connected” means that no intervening element, such as layer, film, area, or plate, between the element and other elements. For example, the expression “directly arranged” means that two layers or two members are arranged or formed next to (e.g., in contact with) each other with no additional member or material such as an adhesive material therebetween.

Like numerals refer to like elements throughout. In the drawings, the thickness, ratio, and dimension of components are exaggerated for effective description of the technical content. As used herein, the term “and/or” includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, “a”, “an” and “the” are intended to include the plural forms as well, unless the context clearly indicates otherwise.

Spatially relative terms, such as “beneath”, “below”, “lower”, “above”, “upper” and the like, may be used herein for ease of description to describe one element or feature’s relationship to another element(s) or feature(s) as illustrated in the figures.

It will be further understood that the terms “includes” and/or “including”, when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, the present disclosure will be explained in more detail with reference to the accompanying drawings.

FIG. 1 is a perspective view showing a display device DD according to some embodiments of the present disclosure. The display device DD may be activated in response to electrical signals. For example, the display device DD may be applied to a large-sized electronic item, such as a television set or an outdoor billboard, and a small and medium-sized electronic item, such as a mobile phone, a tablet computer, a navigation unit, or a game unit. However, these are merely examples, and the display device DD may be applied to other display items as long as they do not depart from the inventive concept of the present disclosure. FIG. 1 shows the mobile phone as a representative example of the display device DD.

Referring to FIG. 1, the display device DD may display one or more images IM toward a third direction DR3 through a display surface IS that is substantially parallel to each of a first direction DR1 and a second direction DR2. The third direction DR3 may be substantially parallel to a normal line direction of the display surface IS. The display surface IS through which the image IM is displayed may correspond to a front surface of the display device DD. The image IM may include a still image as well as a video. FIG. 1 shows a clock widget and application icons as a representative example of the image IM.

According to some embodiments, front (or upper) and rear (or lower) surfaces of each member or each unit may be defined with respect to a direction in which the image IM is displayed. The front and rear surfaces may be opposite to each other in the third direction DR3, and a normal line direction of each of the front and rear surfaces may be substantially parallel to the third direction DR3. A separation distance between the front and rear surfaces of each member (or each unit) in the third direction DR3 may correspond to a thickness in the member (or the unit) in the third direction DR3. In the present disclosure, the expression "when viewed in a plane" or "in a plan view" may mean a state that each member (or each unit) is viewed in the third direction DR3. Meanwhile, directions indicated by the first, second, and third directions DR1, DR2, and DR3 are relative to each other, and thus, the directions indicated by the first, second, and third directions DR1, DR2, and DR3 may be changed to other directions.

The display device DD may sense an external input applied thereto from the outside. The external input may include inputs of various forms provided from the outside of the display device DD. For example, the external input may include various forms, such as force, pressure, temperature, or light. The external input may include external inputs in proximity to or approaching close to the display device DD at a distance (e.g., a set or predetermined distance) (e.g., a hovering input) as well as a touch input making contact with the display device DD, e.g., a contact by a hand or finger of a user or a pen or stylus.

The display surface IS of the display device DD may be divided into a transmission area TA and a bezel area BZA. The image IM may be displayed through the transmission area TA. The bezel area BZA may have a color (e.g., a set or predetermined color) and may block light. That is, the bezel area BZA may not display images and may not enable light to pass through, or allow components or elements to be visible through the bezel area BZA. The bezel area BZA may be defined or located adjacent to (e.g., outside a periphery or footprint of) the transmission area TA. According to some embodiments, the bezel area BZA may be defined adjacent to only one side of the transmission area TA or may be omitted. In addition, the bezel area BZA may be located at a side surface rather than the front surface of the display device DD.

According to some embodiments, the display device DD may be flexible. The term "flexible" used herein refers to the property of being able to be bent, and the flexible display device may include all structures from a structure that is completely bent to a structure that is bent at the scale of a few nanometers. For example, the flexible display device DD may be a curved display device or a foldable display device. According to some embodiments, the display device DD may be rigid.

Figure 2:
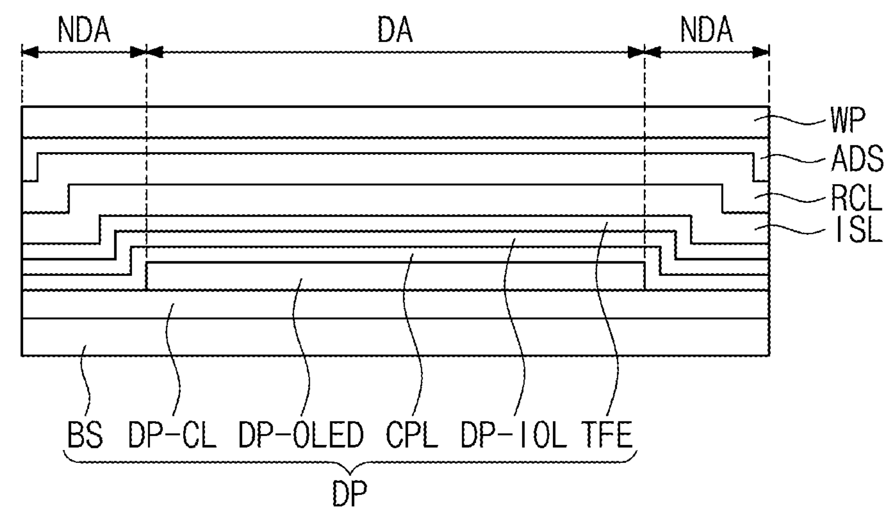
FIG. 2 is a cross-sectional view showing a display device according to some embodiments of the present disclosure.
Figure 3A:
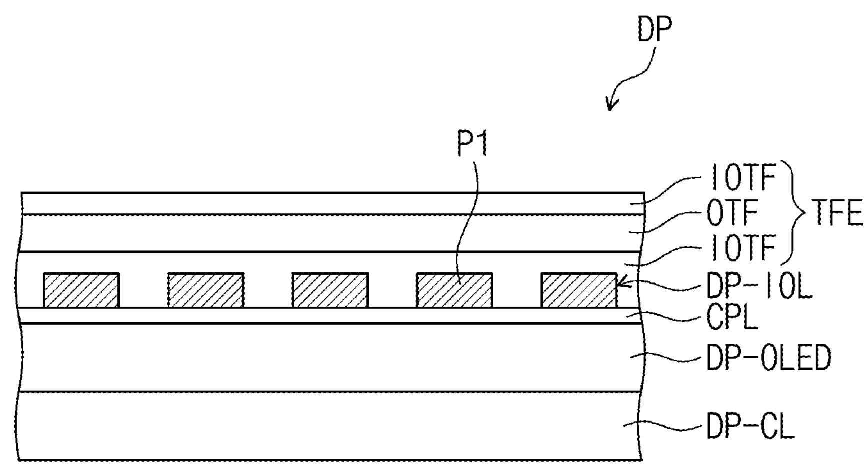
FIG. 3A is a cross-sectional view showing a display panel according to some embodiments of the present disclosure.
Figure 3B:
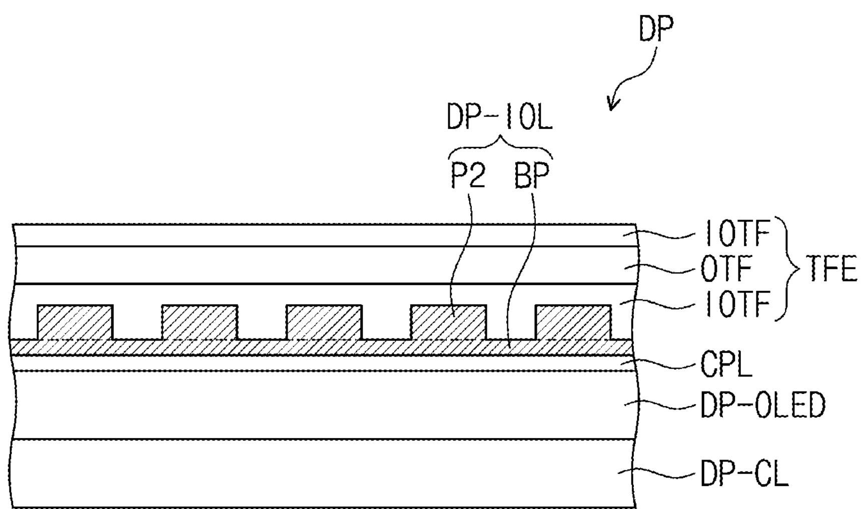
FIG. 3B is a cross-sectional view showing a display panel according to some embodiments of the present disclosure.

FIG. 2 is a cross-sectional view showing the display device DD according to some embodiments of the present disclosure. FIG. 3A is a cross-sectional view showing a display panel DP according to some embodiments of the present disclosure. FIG. 3B is a cross-sectional view showing a display panel DP according to some embodiments of the present disclosure. FIGS. 3A and 3B show pattern layers DP-IOL of the display panels DP according to various embodiments.

Referring to FIG. 2, the display device DD may include the display panel DP, an input sensor ISL, a reflection control layer RCL, and a window WP.

The display panel DP may have a configuration that substantially generates the image or images IM. The display panel DP may be a light emitting type display panel. For example, the display panel DP may be an organic light emitting display panel, an inorganic light emitting display panel, a micro-LED display panel, or a nano-LED display panel. The display panel DP may be referred to a display layer.

The display panel DP may include a base layer BS, a circuit layer DP-CL, a light emitting element layer DP-OLED, a capping layer CPL, a pattern layer DP-IOL, and an encapsulation layer TFE.

The display panel DP may include a display area DA and a non-display area NDA defined therein to respectively correspond to the transmission area TA and the bezel area BZA shown in FIG. 1. In the present disclosure, the expression "an area (or a portion) corresponds to another area (or another portion)" means that "an area (or a portion) overlaps another area (or another portion)", but the expression should not be limited to "an area (or a portion) has the same area and/or the same shape as another area (or another portion)".

The base layer BS may be a member that provides a base surface on which the circuit layer DP-CL is located. The base layer BS may be a rigid substrate or a flexible substrate that is bendable, foldable, or rollable. The base layer BS may be a glass substrate, a metal substrate, or a polymer substrate, however, it should not be limited thereto or thereby. According to some embodiments, the base layer BS may be an inorganic layer, an organic layer, or a composite material layer. According to some embodiments, the base layer BS may include an organic layer formed of transparent polyimide.

The base layer BS may have a multi-layer structure. As an example, the base layer BS may include a first synthetic rein layer, an inorganic layer having a single-layer or multi-layer structure, and a second synthetic rein layer located on the inorganic layer having the single-layer or multi-layer structure. Each of the first and second synthetic rein layers may include a polyimide-based resin, however, embodiments according to the present disclosure are not limited thereto.

The circuit layer DP-CL may be located on the base layer BS. The circuit layer DP-CL may include an insulating layer, a semiconductor pattern, a conductive pattern, and a signal line. As an example, an insulating layer, a semiconductor layer, and a conductive layer may be formed on the base layer BS by a coating or depositing process. Then, the insulating layer, the semiconductor layer, and the conductive layer may be selectively patterned by several photolithography processes. The semiconductor pattern, the conductive pattern, and the signal line included in the circuit layer DP-CL may be formed.

According to some embodiments, the circuit layer DP-CL may be located on the base layer BS and may include at least one transistor. The transistor may include a control electrode, an input electrode, and an output electrode. As an example, the circuit layer DP-CL may include a switching transistor and a driving transistor to drive a light emitting element OLED of the light emitting element layer DP-OLED.

The light emitting element layer DP-OLED may be located on the circuit layer DP-CL. The light emitting element layer DP-OLED may include the light emitting element OLED. As an example, the light emitting element layer DP-OLED may include an organic light emitting material, an inorganic light emitting material, an organic-inorganic light emitting material, a quantum dot, a quantum rod, a micro-LED, or a nano-LED.

The capping layer CPL may be located on the light emitting element layer DP-OLED. The capping layer CPL may protect the light emitting element layer DP-OLED. In addition, the capping layer CPL may allow a light generated by the light emitting element OLED to be efficiently emitted to the outside.

The encapsulation layer TFE may be located on the light emitting element layer DP-OLED. The encapsulation layer TFE may protect the light emitting element layer DP-OLED from moisture, oxygen, and a foreign substance such as dust particles.

The pattern layer DP-IOL may be located between the capping layer CPL and the encapsulation layer TFE. The pattern layer DP-IOL may reduce a reflected light generated by a second electrode CE (refer to FIG. 5A) or another metal layer included in the light emitting element layer DP-OLED. As an example, the pattern layer DP-IOL may cause a destructive interfere between the reflected light reflected by the second electrode CE (refer to FIG. 5A) and traveling upward to the encapsulation layer TFE and the reflected light reflected by the pattern layer DP-IOL and traveling upward to the encapsulation layer TFE, and thus, low reflection characteristics of the display panel DP may be implemented.

According to some embodiments, the pattern layer DP-IOL may include a plurality of protrusions P1 and P2 and may be located on the capping layer CPL.

Referring to FIG. 3A, the protrusions P1 of the pattern layer DP-IOL may be located directly on the capping layer CPL while defining a separation space therebetween in one direction. The encapsulation layer TFE may be located on the protrusions P1 and may be filled in the separation space between the protrusions P1, and thus, a contact area between the protrusions P1 and the encapsulation layer TFE may increase. The encapsulation layer TFE filled in the separation space between the protrusions P1 may be formed or located directly on the capping layer CPL located under the pattern layer DP-IOL.

Referring to FIG. 3B, the protrusions P2 may be formed on a base portion BP to protrude from the base portion BP. The base portion BP may be located directly on the capping layer CPL, and the protrusions P2 may be located on the capping layer CPL with the base portion BP interposed therebetween. In this case, the encapsulation layer TFE may be filled in a space between the protrusions P2, and thus, a contact area between the protrusions P2 and the encapsulation layer TFE may increase. The input sensor ISL may be located on the display panel DP. The input sensor ISL may sense an external input applied thereto from the outside. For example, the external input may be a user input. The user input may include a variety of external inputs, such as a part of user's body, light, heat, pen, or pressure.

The input sensor ISL may be formed on the display panel DP through successive processes. In this case, the input sensor ISL may be located directly on the display panel DP. In the present disclosure, the expression that a component "B" is located directly on a component "A" means that no intervening elements are present between the component "B" and the component "A". That is, a separate adhesive member may not be located between the input sensor ISL and the display panel DP. According to some embodiments, the input sensor ISL may be combined with the display panel DP by an adhesive member. The adhesive member may include an ordinary adhesive, or any suitable adhesive material.

The reflection control layer RCL may be located on the input sensor ISL. The reflection control layer RCL may reduce a reflectance with respect to the external light incident into the display device DD from the outside. In addition, the reflection control layer RCL may serve as an anti-reflective member in conjunction with the pattern layer DP-IOL. That is, the reflection control layer RCL may be used together with the pattern layer DP-IOL and may reduce the reflected light reflected from metal layers included in the display panel DP. As an example, the reflection control layer RCL may be used with the pattern layer DP-IOL and may reduce the reflected light reflected from a common electrode of the light emitting element. The reflection control layer RCL may be located directly on the input sensor ISL through successive processes.

The reflection control layer RCL may include a light blocking pattern BM (refer to FIG. 5A) overlapping the pattern layer DP-IOL located under the reflection control layer RCL. The reflection control layer RCL may further include a color filter CF (refer to FIG. 5A) overlapping a light emitting area described later. The color filter CF (refer to FIG. 5A) may include a first color filter, a second color filter, and a third color filter, which correspond to a first color pixel, a second color pixel, and a third color pixel, respectively. The reflection control layer RCL will be described in more detail later.

The window WP may be located on the reflection control layer RCL. The window WP and the reflection control layer RCL may be coupled to each other by an adhesive member ADS. The adhesive member ADS may be a pressure sensitive adhesive (PSA) film or an optically clear adhesive (OCA).

The window WP may include at least one base layer. The base layer may be a glass substrate or a synthetic resin film. The window WP may have a multi-layer structure. The window WP may include a thin film glass substrate and a synthetic resin film located on the thin film glass substrate. The thin film glass substrate and the synthetic resin film may be coupled to each other by an adhesive layer, and the adhesive layer and the synthetic resin film may be separated from the thin film glass substrate for their replacement.

According to some embodiments, the adhesive member ADS may be omitted, and the window WP may be located directly on the reflection control layer RCL. According to some embodiments, an organic material, an inorganic material, or a ceramic material may be coated on the reflection control layer RCL as a base layer.

Figure 4A:
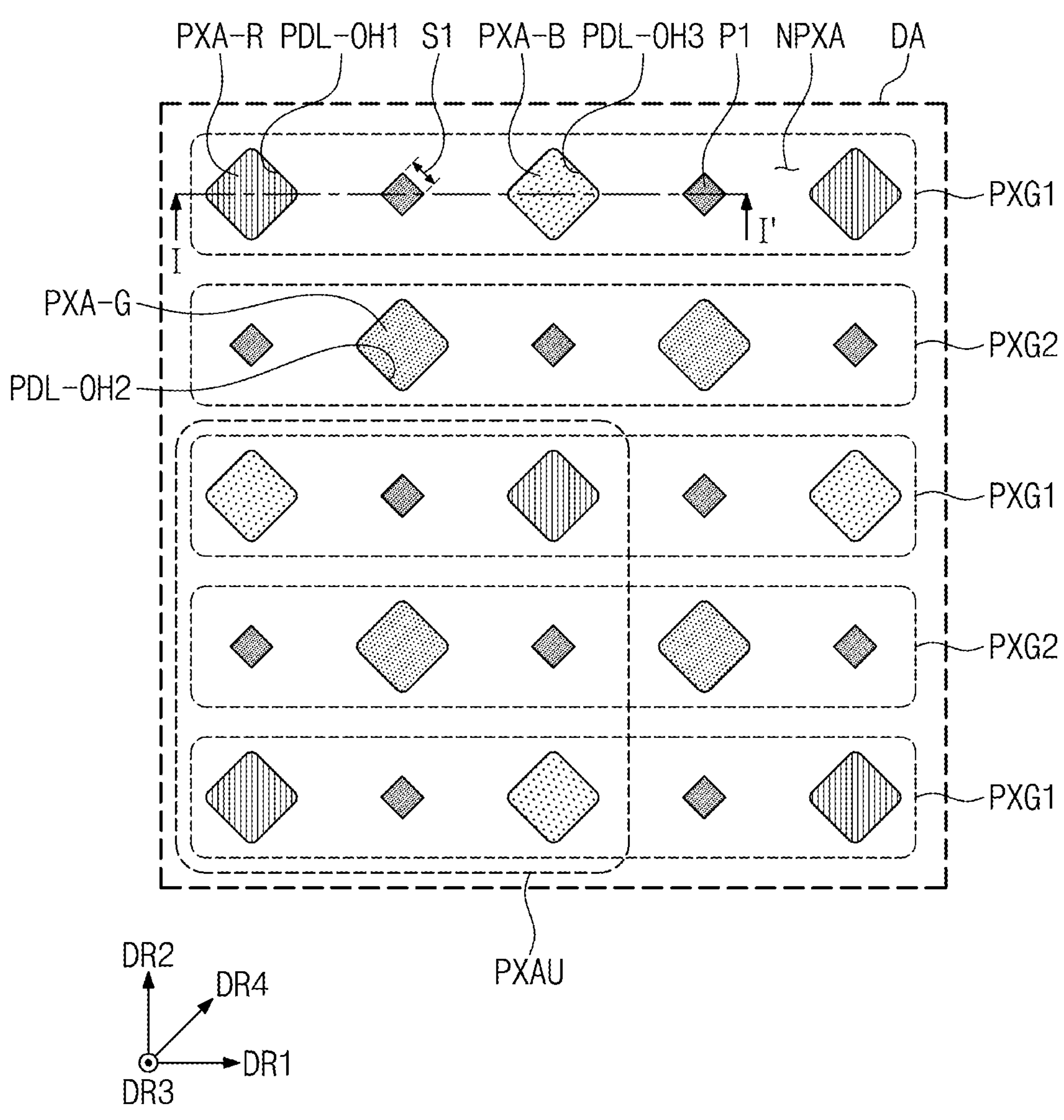
FIG. 4A is an enlarged plan view showing a display panel according to some embodiments of the present disclosure.
Figure 4B:
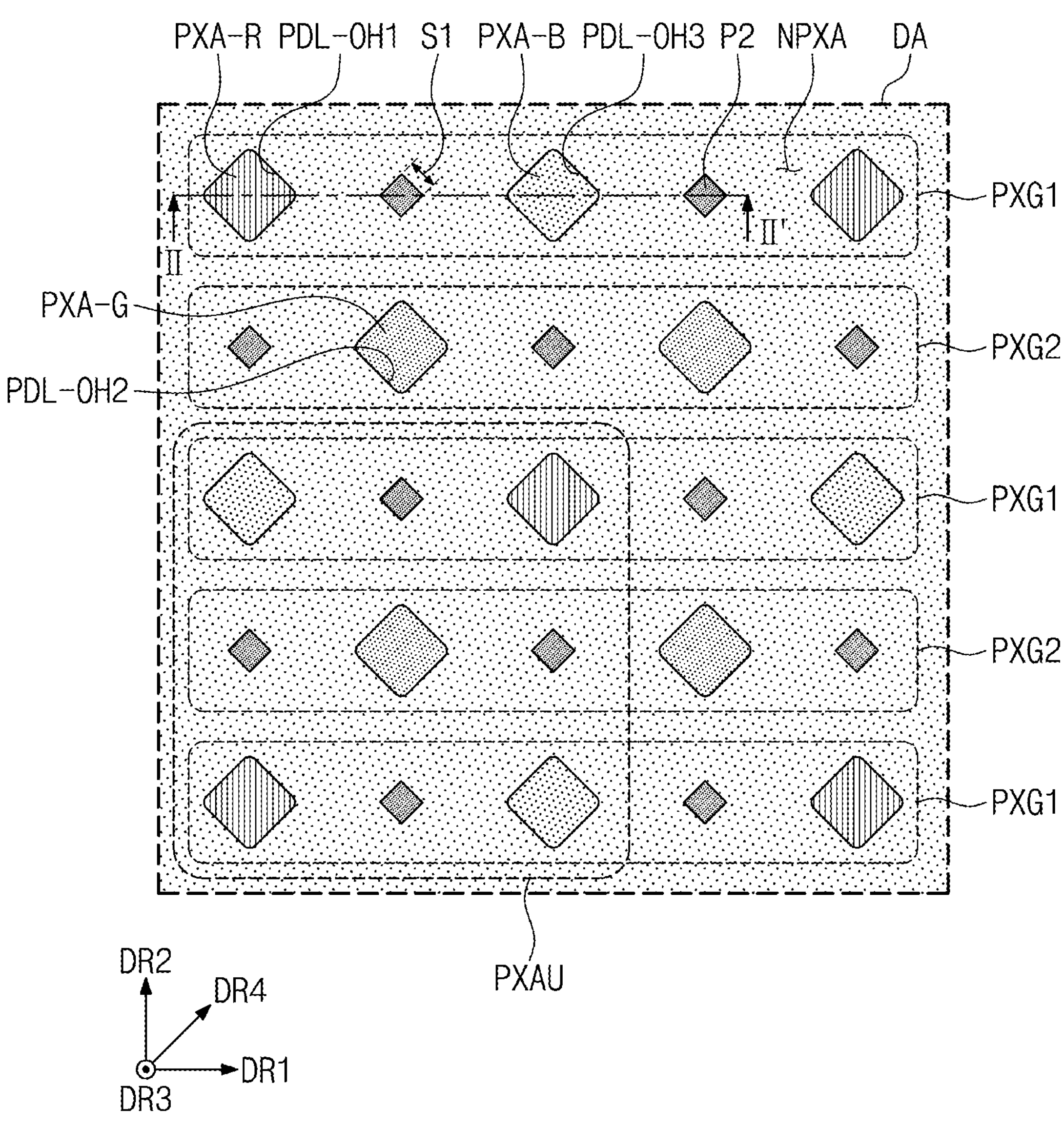
FIG. 4B is an enlarged plan view showing a display panel according to some embodiments of the present disclosure.
Figure 4C:
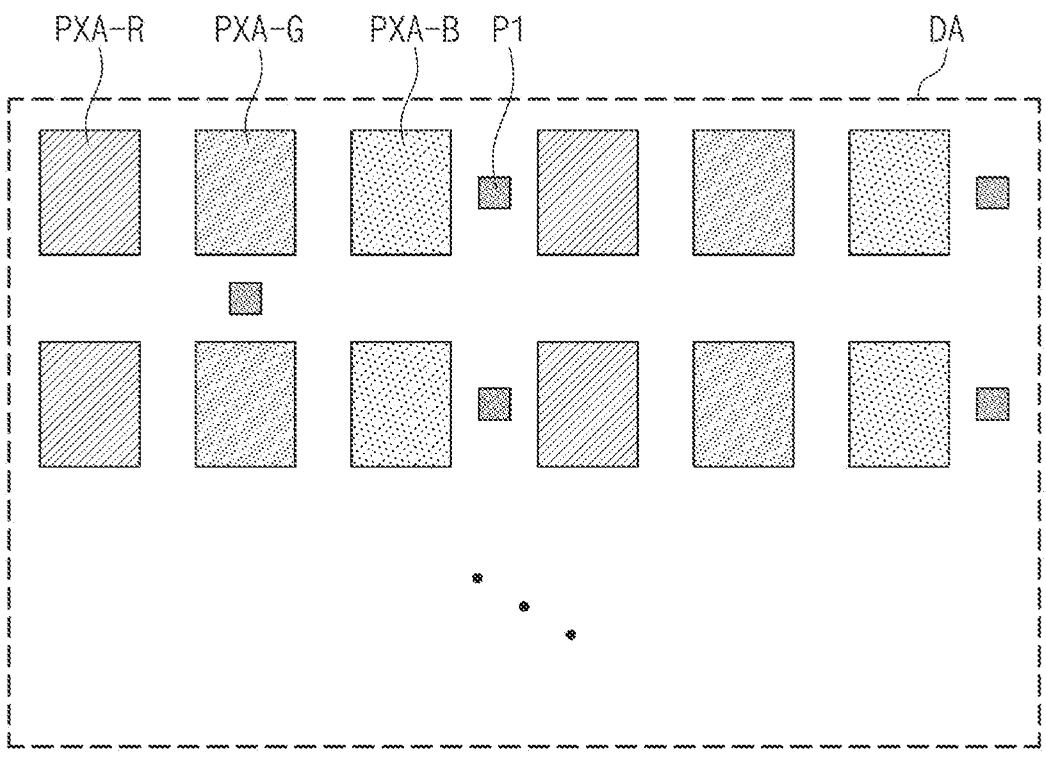
FIG. 4C is an enlarged plan view showing a display panel according to some embodiments of the present disclosure.

FIGS. 4A to 4C are enlarged plan views showing display panels DP according to some embodiments of the present disclosure. FIGS. 4A to 4C show a portion of a display area DA.

FIG. 4A is an enlarged plan view showing the display panel DP including the pattern layer DP-IOL shown in FIG. 3A. FIG. 4B is an enlarged plan view showing the display panel DP including the pattern layer DP-IOL shown in FIG. 3B. Meanwhile, FIG. 4C is an enlarged plan view showing a display area DA of the display panel including light emitting areas arranged in a different manner from those of FIGS. 4A and 4B.

Referring to FIGS. 4A to 4C, the display area DA may include a plurality of light emitting areas PXA-R, PXA-G, and PXA-B and a non-light-emitting area NPXA defined adjacent to the light emitting areas PXA-R, PXA-G, and PXA-B. The light emitting areas PXA-R, PXA-G, and PXA-B may be areas from which lights are emitted. The non-light-emitting area NPXA may surround the light emitting areas PXA-R, PXA-G, and PXA-B and may define a boundary between the light emitting areas PXA-R, PXA-G, and PXA-B. According to some embodiments, each of the protrusions P1 and P2 included in the pattern layer DP-IOL may not overlap the light emitting areas PXA-R, PXA-G, and PXA-B and may overlap the non-light-emitting area NPXA.

The light emitting areas PXA-R, PXA-G, and PXA-B may include a plurality of first color light emitting areas PXA-R, a plurality of second color light emitting areas PXA-G, and a plurality of third light emitting areas PXA-B. The first, second, and third color light emitting areas PXA-R, PXA-G, and PXA-B may emit lights having different colors from each other. As an example, each first color light emitting area PXA-R may emit a red light, each second color light emitting area PXA-G may emit a green light, and each third color light emitting area PXA-B may emit a blue light, however, they should not be limited thereto or thereby. According to some embodiments, the color lights emitted from the first, second, and third color light emitting areas PXA-R, PXA-G, and PXA-B may be selected as a combination of three color lights that may generate a white light when being mixed together. According to some embodiments, the first, second, and third color light emitting areas PXA-R, PXA-G, and PXA-B may emit the light having the same color.

Figure 5A:
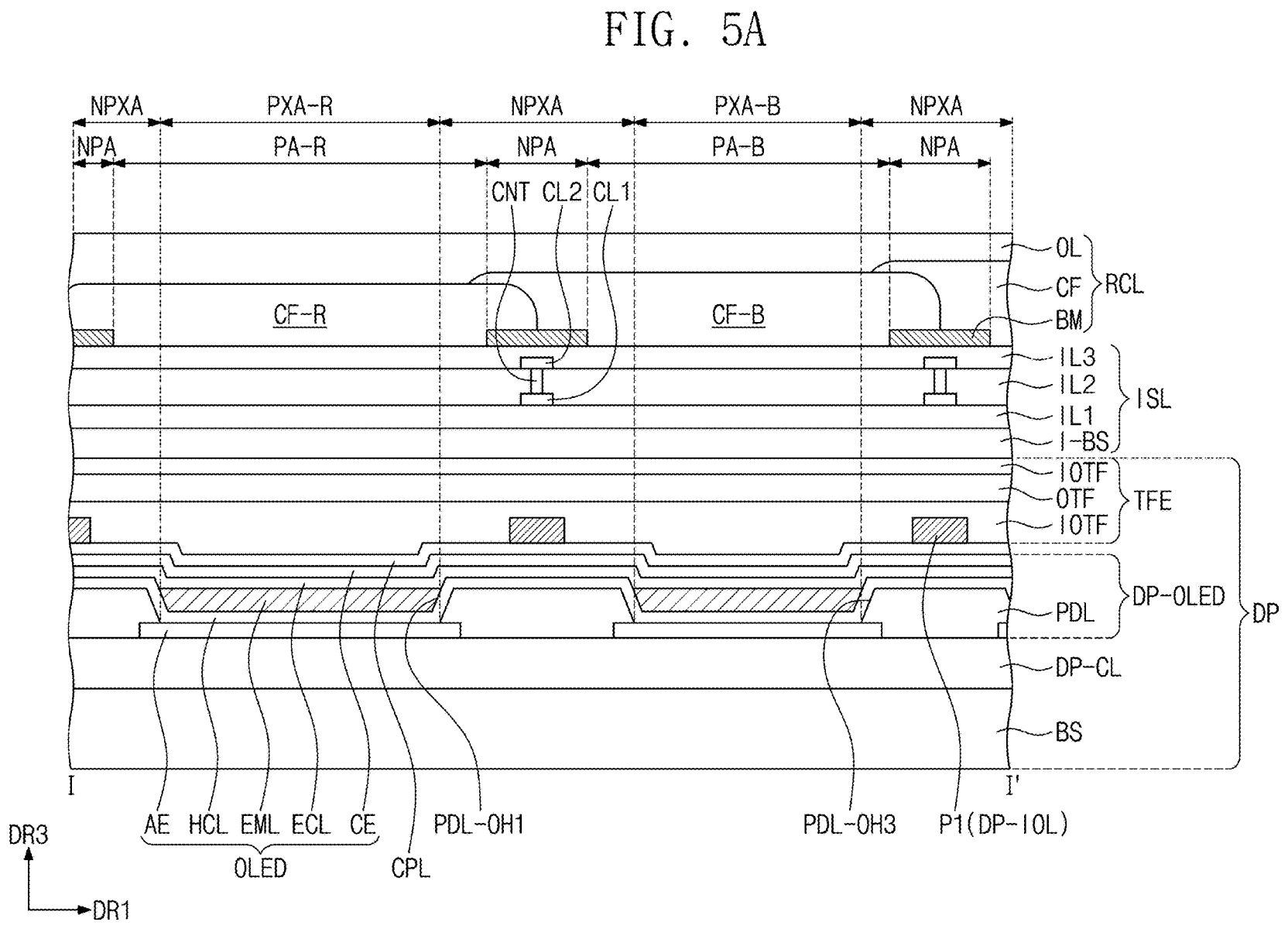
Figure 5B:
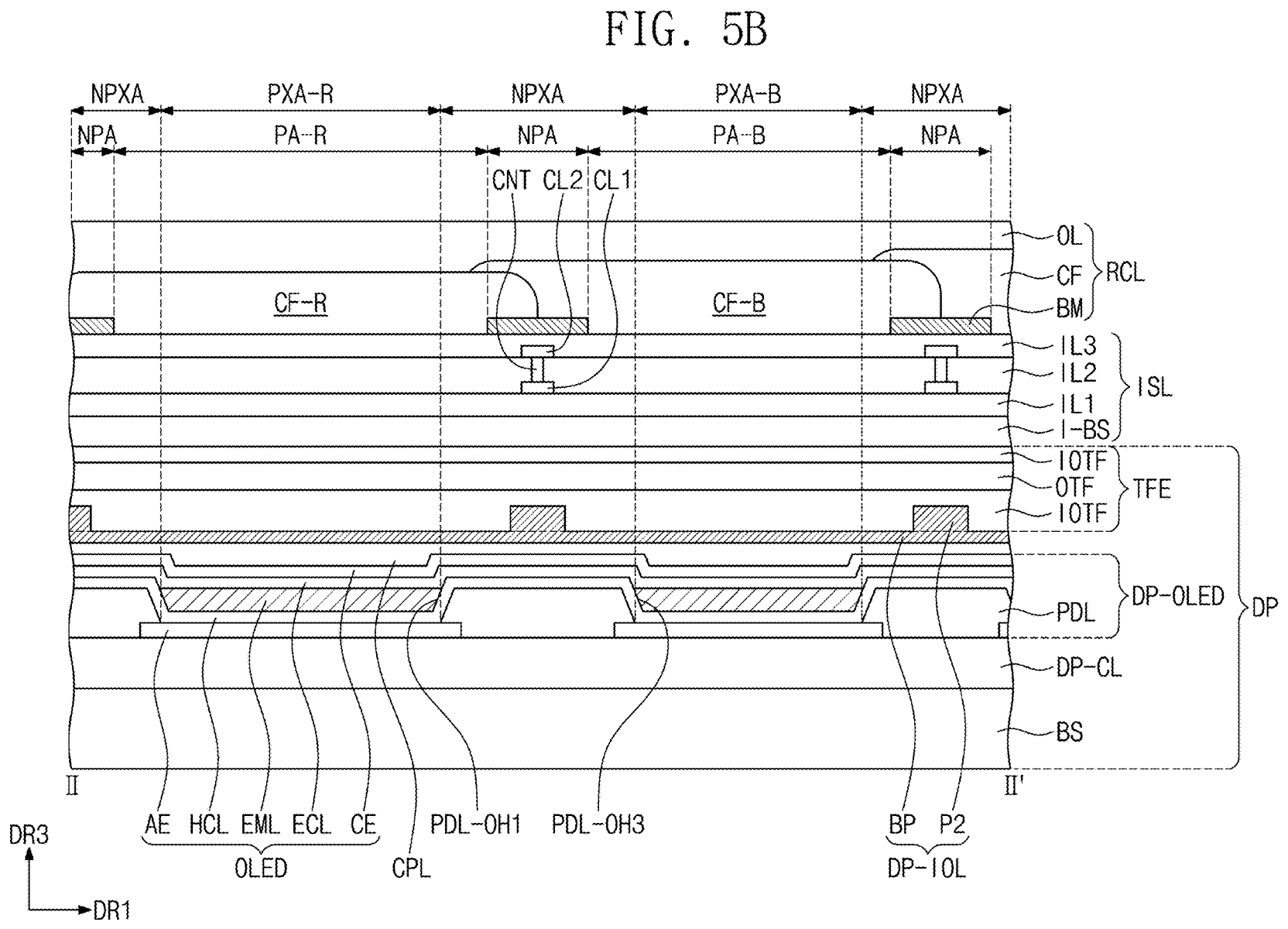

According to some embodiments, the display panel DP may include a plurality of light emitting layers EML arranged to correspond to a plurality of light emitting openings PDL-OH1, PDL-OH2, and PDL-OH3 defined through a pixel definition layer PDL (refer to FIGS. 5A and 5B). The light emitting openings PDL-OH1, PDL-OH2, and PDL-OH3 may have opening sizes respectively corresponding to the light emitting areas PXA-R, PXA-G, and PXA-B. The pixel definition layer PDL may correspond to the non-light-emitting area NPXA and may prevent or reduce mixing of the colors of the lights emitted from the light emitting areas PXA-R, PXA-G, and PXA-B.

The light emitting openings PDL-OH1, PDL-OH2, and PDL-OH3 may include a first light emitting opening PDL-OH1, a second light emitting opening PDL-OH2, and a third light emitting opening PDL-OH3. The first light emitting opening PDL-OH1 may correspond to the first color light emitting area PXA-R. The second light emitting opening PDL-OH2 may correspond to the second color light emitting area PXA-G, and the third light emitting opening PDL-OH3 may correspond to the third color light emitting area PXA-B.

Each of the light emitting areas PXA-R, PXA-G, and PXA-B may be arranged to be spaced apart from each other in one direction. According to some embodiments, the light emitting areas PXA-R, PXA-G, and PXA-B may be arranged in the first direction DR1 and the second direction DR2 perpendicular to the first direction DR1 at intervals (e.g., set or predetermined intervals). In this case, each of the protrusions P1 and P2 may overlap the non-light-emitting area NPXA located between the light emitting areas PXA-R, PXA-G, and PXA-B.

Referring to FIGS. 4A and 4B, the light emitting areas PXA-R, PXA-G, and PXA-B may be arranged according to a certain rule. According to some embodiments, the first color light emitting areas PXA-R may be alternately arranged with the third color light emitting areas PXA-B in the first direction DR1 to form a first light emitting group PXG1. The second color light emitting areas PXA-G may be arranged in the first direction DR1 to form a second light emitting group PXG2.

The first light emitting group PXG1 may be spaced apart from the second light emitting group PXG2 in the second direction DR2. Each of the first light emitting group PXG1 and the second light emitting group PXG2 may be provided in plural. The first light emitting groups PXG1 may be alternately arranged with the second light emitting groups PXG2 in the second direction DR2.

One second color light emitting area PXA-G may be spaced apart from one first color light emitting area PXA-R and/or one third color light emitting area PXA-B in a fourth direction DR4. The fourth direction DR4 may be a direction defined between the first direction DR1 and the second direction DR2.

According to some embodiments, each of the protrusions P1 and P2 may overlap the non-light-emitting area NPXA defined between the first color light emitting area PXA-R and the third color light emitting area PXA-B, which are adjacent to each other, and may overlap the non-light-emitting area NPXA defined between the second color light emitting areas PXA-G adjacent to each other.

According to some embodiments, the light emitting areas PXA-B, PXA-G, and PXA-R may be arranged in a pentile structure, however, embodiments according to the present disclosure are not limited thereto or thereby. According to some embodiments, sizes of the light emitting areas PXA-B, PXA-G, and PXA-R, a combination of the number of the light emitting areas PXA-B, PXA-G, and PXA-R emitting different lights from each other, and a shape of the light emitting areas PXA-B, PXA-G, and PXA-R in a plane may be adjusted or modified in various ways according to the characteristics of display quality required for the display device DD.

Referring to FIGS. 4A and 4B, one first color light emitting area PXA-R, one third color light emitting area PXA-B, and two second color light emitting areas PXA-G, which are located adjacent to each other, may form one unit light emitting group PXAU in the display device. Each of the protrusions P1 and P2 may overlap the non-light-emitting area NPXA in one unit light emitting group. In addition, each of the protrusions P1 and P2 may overlap the non-light-emitting area NPXA defined between the unit light emitting groups adjacent to each other.

Meanwhile, the arrangement of the light emitting areas PXA-R, PXA-G, and PXA-B of the display device DD should not be limited to the arrangement shown in FIGS. 4A and 4B. According to some embodiments, the light emitting areas PXA-R, PXA-G, and PXA-B may be arranged in a stripe structure in which the first color light emitting area PXA-R, the second color light emitting area PXA-G, and the third color light emitting area PXA-B are sequentially and alternately arranged in the first direction DR1 as shown in FIG. 4C. As an example, the protrusions P1 located directly on the capping layer CPL may overlap the non-light-emitting area between the first color light emitting area PXA-R and the third color light emitting area PXA-B, which are arranged in the first direction DR1 and spaced apart from each other. According to some embodiments, the protrusions protruding from the base portion, which is located directly on the capping layer, may be arranged in the same manner as the protrusions P1 shown in FIG. 4C.

In FIGS. 5A and 5B, the same reference numerals denote the same elements in FIGS. 1 to 4C, and thus, detailed descriptions of the same elements will be omitted and different features will be mainly described.

FIGS. 5A and 5B are cross-sectional views showing display devices according to some embodiments of the present disclosure. FIG. 5A is a cross-sectional view taken along a line I-I' of FIG. 4A to show the display device. FIG. 5B is a cross-sectional view taken along a line II-II' of FIG. 4B to show the display device.

The light emitting element layer DP-OLED may be located on the circuit layer DP-CL. The light emitting element layer DP-OLED may include the light emitting elements OLED, the pixel definition layer PDL, the capping layer CPL, the pattern layer DP-IOL, and the encapsulation layer TFE.

The light emitting element OLED may include a first electrode AE (or a pixel electrode), a hole control layer HCL, a light emitting layer EML, an electron control layer ECL, a second electrode CE (or a common electrode).

The first electrode AE may be located on the circuit layer DP-CL. The first electrode CE may be patterned to correspond to the light emitting areas PXA-R and PXA-B. The first electrode AE may be electrically connected to a transistor of the circuit layer DP-CL via a contact hole defined through the intermediate insulating layer included in the circuit layer DP-CL.

The pixel definition layer PDL may be located on the circuit layer DP-CL. The pixel definition layer PDL may cover a portion of the first electrode AE. As an example, the light emitting openings PDL-OH1 and PDL-OH3 may be defined through the pixel definition layer PDL to expose the portion of the first electrode AE. The light emitting openings PDL-OH1 and PDL-OH3 of the pixel definition layer PDL may define the light emitting areas PXA-R and PXA-B.

According to some embodiments, the pixel definition layer PDL may have a property that absorbs a light, and as an example, the pixel definition layer PDL may have a black color. The pixel definition layer PDL may include a black coloring agent. The black coloring agent may include a black dye or a black pigment. The black coloring agent may include a metal material, such as carbon black, chromium, or oxide thereof. The pixel definition layer PDL may be a light blocking pattern having a light blocking property.

The light emitting layer EML may be located on the first electrode AE. The light emitting layer EML may be located in areas corresponding to the light emitting openings PDL-OH1 and PDL-OH3 of the pixel definition layer PDL. The light emitting layer EML may include an organic light emitting material, an inorganic light emitting material, a quantum dot, or a quantum rod.

The light emitting layer EML may be respectively formed in the light emitting areas after being divided into a plurality of portions. Each of the portions of the light emitting layer EML may generate one of a red light, a green light, and a blue light, however, the light emitting layer EML may be commonly located in the light emitting areas to emit the blue or white light. In addition, the light emitting layer EML may have a multi-layer structure that is called a tandem.

The second electrode CE may be located on the light emitting layer EML. The second electrode CE may be commonly located in the light emitting areas PXA-R and PXA-B and the non-light-emitting area NPXA. A common voltage may be applied to the second electrode CE, and the second electrode CE may be referred to as a common electrode.

The hole control layer HCL may be located between the first electrode AE and the light emitting layer EML. The hole control layer HCL may include a hole transport layer and may further include a hole injection layer. The electron control layer ECL may be located between the light emitting layer EML and the second electrode CE. The electron control layer ECL may include an electron transport layer and may further an electron injection layer.

The capping layer CPL may be located on the second electrode CE. According to some embodiments, the capping layer CPL may be an organic layer. As an example, in a case where the capping layer CPL includes an organic material, the organic material may include α-NPD, NPB, TPD, m-MTDATA, $Alq_3$, CuPc, TPD15(N4,N4,N4',N4'-tetra (biphenyl-4-yl) biphenyl-4,4'-diamine), TCTA(4,4',4"-Tris (carbazol sol-9-yl) triphenylamine), an epoxy resin, or an acrylic-based resin such as methacrylate.

The capping layer CPL may be entirely located on the light emitting element OLED. The capping layer CPL may overlap the light emitting areas PXA-R and PXA-B and the non-light-emitting area NPXA.

The pattern layer DP-IOL may be located on the capping layer CPL. Referring to FIG. 5A, the pattern layer DP-IOL may include the protrusions P1 located directly on the capping layer CPL and spaced apart from each other. According to some embodiments, the base portion BP may be located directly on the capping layer CPL, and the protrusions P2 may protrude from the base portion BP as shown in FIG. 5B. The protrusions P1 and P2 may be spaced apart from the light emitting areas PXA-R and PXA-B adjacent thereto when viewed in the third direction DR3, i.e., when viewed from a direction perpendicular to a plane substantially parallel to the capping layer CPL, or from a plan view (e.g., a view perpendicular or normal with respect to a plane that is parallel to a display surface of the display device DD).

The pattern layer DP-IOL may include one inorganic material or a mixture of a plurality of inorganic materials. As an example, the pattern layer DP-IOL may include at least one of Ag, Mg, Mn, Bi, Yb, Zn, Te, or Se.

The pattern layer DP-IOL may be provided on the capping layer CPL by a thermal evaporation method. As an example, the pattern layer DP-IOL shown in FIG. 5A may be patterned using a patterned mask. The pattern layer DP-IOL shown in FIG. 5B may be patterned by depositing an inorganic material on an entire upper surface of the capping layer CPL using the thermal evaporation method and etching the organic material.

Each of the protrusions P1 and P2 may have a polygonal shape on a plane where the first direction DR1 crosses the second direction DR2. As an example, each of the protrusions P1 and P2 may have a quadrangular shape on the plane where the first direction DR1 and the second direction DR2. As an example, each of the protrusions P1 and P2 may have the quadrangular shape of which at least one side has a length from about 10 μm to about 15 μm. For example, each of the protrusions P1 and P2 may have a lozenge shape when viewed in a plane.

According to some embodiments of the present disclosure, the polygonal shape and the quadrangular shape may include a shape with rounded vertices. That is, the protrusions P1 and P2 may have the quadrangular shape with rounded vertices. Each of the protrusions P1 and P2 may have a thickness from about 80 angstroms (Å) to about 100 angstroms (Å), however, it should not be limited thereto or thereby.

The encapsulation layer TFE may be located on the pattern layer DP-IOL. The encapsulation layer TFE may include an inorganic layer and an organic layer. As an example, the encapsulation layer TFE may include a plurality of inorganic layers IOTF and an organic layer OTF located between the inorganic layers IOTF, however, the structure of the encapsulation layer TFE should not be limited thereto or thereby.

FIGS. 5A and 5B show a structure in which a first inorganic layer IOTF, an organic layer OTF, and a second inorganic layer IOTF of the encapsulation layer TFE are sequentially stacked on the pattern layer DP-IOL. Referring to FIGS. 5A and 5B, the first inorganic layer IOTF may cover the pattern layer DP-IOL. As an example, the first inorganic layer IOTF may be filled in between the protrusions P1 located on the capping layer CPL and spaced apart from each other as shown in FIG. 5A. In this case, the first inorganic layer IOTF may be located directly on the capping layer CPL between the protrusions P1. In addition, the first inorganic layer IOTF may be filled in between the protrusions P2 protruding from the base portion BP and may be located directly on the base portion BP between the protrusions P2 as shown in FIG. 5B.

The inorganic layer IOTF may protect the light emitting element OLED from moisture and/or oxygen. As an example, the inorganic layer IOTF may include a silicon nitride layer, a silicon oxynitride layer, a silicon oxide layer, a titanium oxide layer, or an aluminum oxide layer, however, it should not be particularly limited. The organic layer OTF may protect the light emitting element OLED from a foreign substance such as dust particles. The organic layer OTF may include an acrylic-based organic layer, however, it should not be particularly limited.

According to some embodiments, as the first inorganic layer IOTF located at a lowermost position of the encapsulation layer TFE is filled in between the protrusions P1 and P2, the contact area between the encapsulation layer TFE and the pattern layer DP-IOP may increase, and thus, the adhesive force may be improved.

The input sensor ISL may be located on the display panel DP. The input sensor ISL may include a sensing base layer I-BS, a first conductive pattern CL1, insulating layers IL1, IL2, and IL3, and a second conductive pattern CL2.

The sensing base layer I-BS may be located directly on the display panel DP. The sensing base layer I-BS may be an inorganic layer including at least one of silicon nitride, silicon oxynitride, or silicon oxide. According to some embodiments, the sensing base layer I-BS may be an organic layer including an epoxy resin, an acrylic resin, or an imide-based resin. The sensing base layer I-BS may have a single-layer structure or a multi-layer structure of layers stacked in the third direction DR3.

Each of the first conductive pattern CL1 and the second conductive pattern CL2 may have a single-layer structure or a multi-layer structure of layers stacked in the third direction DR3. The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), zinc peroxide ($ZnO_2$), indium zinc tin oxide (ITZO), or the like. In addition, the transparent conductive layer may include conductive polymer such as PEDOT, metal nanowire, graphene, or the like.

The conductive layer having the multi-layer structure may include metal layers. The metal layers may have a three-layer structure of titanium/aluminum/titanium. The conductive layer having the multi-layer structure may include at least one metal layer and at least one transparent conductive layer.

The insulating layers IL1, IL2, and IL3 may be located under the first conductive pattern CL1, between the first conductive pattern CL1 and the second conductive pattern CL2, and on the second conductive pattern CL2. Each of the insulating layers IL1, IL2, and IL3 may include an inorganic layer. The inorganic layer may include at least one of aluminum oxide, titanium oxide, silicon oxide, silicon nitride, silicon oxynitride, zirconium oxide, or hafnium oxide.

According to some embodiments, each of the insulating layers IL1, IL2, and IL3 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyimide-based resin, or a perylene-based resin.

The reflection control layer RCL may be located on the input sensor ISL. The reflection control layer RCL may include a light blocking pattern BM, a color filter CF, and a planarization layer OL.

According to some embodiments, a material for the light blocking pattern BM should not be particularly limited as long as the material may absorb a light. The light blocking pattern BM may have a black color. According to some embodiments, the light blocking pattern BM may include a black coloring agent. The black coloring agent may include a black dye or a black pigment. The black coloring agent may include a metal material, such as carbon black, chromium, or oxide thereof.

The light blocking pattern BM may overlap the protrusions P1 and P2 and the pixel definition layer PDL when viewed in a plane. The light blocking pattern BM may prevent the external light from being reflected by the first conductive pattern CL1 and the second conductive pattern CL2.

The light blocking pattern BM may be provided with an opening. The opening of the light blocking pattern BM may overlap the first electrode AE and may have a size greater than that of the light emitting openings PDL-OH1 and PDL-OH3 defined through the pixel definition layer PDL. According to some embodiments, the opening of the light blocking pattern BM may have substantially the same size as that of the light emitting openings PDL-OH1 and PDL-OH3 defined through the pixel definition layer PDL.

Pixel areas PA-R and PA-B may be defined by the opening of the light blocking pattern BM. The light generated by the light emitting element OLED may be emitted to the outside through the pixel areas PA-R and PA-B. As the size of the pixel areas PA-R and PA-B increases, a brightness of the image may increase.

Color filters CF-R and CF-B may overlap the pixel areas PA-R and PA-B. The color filters CF-R and CF-B may further overlap a non-pixel area NPA. Portions of the color filters CF-R and CF-B may be located on the light blocking pattern BM. The color filters CF-R and CF-B may transmit the light generated by the light emitting element OLED and may block some lights having specific wavelengths among the external light. Accordingly, the color filters CF-R and CF-B may reduce the reflected light generated by the first electrode AE or the second electrode CE.

The planarization layer OL may cover the light blocking pattern BM and the color filters CF-R and CF-B. The planarization layer OL may include an organic material and may provide a flat upper surface thereon.

According to the embodiments, the display device DD may include the pattern layer DP-IOL located between the capping layer CPL and the encapsulation layer TFE of the display panel DP and the reflection control layer RCL, and thus, the reflected light in the display device DD may be reduced. In addition, as the pattern layer DP-IOL is located between the capping layer CPL and the encapsulation layer TFE of the display panel DP of the display device DD, the contact area between the pattern layer DP-IOL and the encapsulation layer TFE may increase, and the adhesive force may be improved. Thus, the reliability of the display device DD may be improved.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims, and their equivalents.

What is claimed is:

1. A display device comprising:

a display panel comprising light emitting areas and a non-light-emitting area adjacent to the light emitting areas;

an input sensor on the display panel; and a reflective control layer on the input sensor, the display panel comprising:

a light emitting element;

a capping layer on the light emitting element and in direct physical contact with the light emitting element;

a pattern layer directly on the capping layer and comprising a plurality of protrusions spaced apart from each other; and an encapsulation layer on the pattern layer, wherein each of the protrusions does not overlap the light emitting areas and overlaps the non-light-emitting area.

2. The display device of claim 1, wherein the encapsulation layer comprises a first inorganic layer, an organic layer on the first inorganic layer, and a second inorganic layer on the organic layer, and the first inorganic layer is filled in between the protrusions.

3. The display device of claim 2, wherein the first inorganic layer is directly on the capping layer between the protrusions.

4. The display device of claim 1, wherein the light emitting areas are adjacent to each other along a first direction and a second direction perpendicular to the first direction, and each of the protrusions overlaps the non-light-emitting area between the light emitting areas.

5. The display device of claim 1, wherein each of the protrusions is spaced apart from the light emitting areas adjacent thereto in a plan view.

6. The display device of claim 1, wherein the light emitting areas comprise:

a first light emitting group comprising a first color light emitting area and a third color light emitting area alternately arranged with the first color light emitting area in a first direction; and a second light emitting group spaced apart from the first light emitting group in a second direction different from the first direction and comprising second color light emitting areas arranged in the first direction, and each of the protrusions overlaps the non-light-emitting area between the first color light emitting area and the third color light emitting area adjacent to the first color light emitting area and the non-light-emitting area between the second color light emitting areas.

7. The display device of claim 6, wherein each of the second color light emitting areas is arranged along a direction between the first direction and the second direction substantially perpendicular to the first direction to be spaced apart from the first color light emitting area and the third color light emitting area.

8. The display device of claim 1, wherein each of the protrusions has a thickness from 80 angstroms to 100 angstroms.

9. The display device of claim 1, wherein the pattern layer comprises at least one of Ag, Mg, Mn, Bi, Yb, Zn, Te, or Se.

10. The display device of claim 1, wherein each of the protrusions has a quadrangular shape in which at least one side has a length from 10 micrometers to 15 micrometers.

11. The display device of claim 1, wherein the reflective control layer comprises first and second color filters configured to transmit light in different wavelength ranges and a light blocking pattern overlapping edges of the first and second color filters, and the protrusions overlap the light blocking pattern.

12. The display device of claim 1, wherein the display panel comprises a pixel definition layer through which a plurality of openings is defined, the openings correspond to the light emitting areas, respectively, and the protrusions are on the pixel definition layer.

13. The display device of claim 1, wherein the light emitting element comprises a first electrode, a second electrode facing the first electrode, and a light emitting layer between the first electrode and the second electrode, and the light emitting layer overlaps the light emitting areas.

14. The display device of claim 13, wherein the protrusions do not overlap the light emitting layer.

15. The display device of claim 1, wherein the capping layer is a common layer that overlaps the light emitting areas and the non-light-emitting area.

16. A display device comprising:

a display panel comprising light emitting areas and a non-light-emitting area adjacent to the light emitting areas;

an input sensor on the display panel; and a reflective control layer on the input sensor, the display panel comprising:

a light emitting element;

a capping layer on the light emitting element and in direct physical contact with the light emitting element;

a pattern layer comprising a base portion directly on the capping layer and a plurality of protrusions protruding from the base portion; and an encapsulation layer on the pattern layer, wherein the base portion entirely overlaps the light emitting areas and the non-light-emitting area, and each of the protrusions does not overlap the light emitting areas and overlaps the non-light-emitting area.

17. The display device of claim 16, wherein the encapsulation layer comprises a first inorganic layer, an organic layer on the first inorganic layer, and a second inorganic layer on the organic layer, and the first inorganic layer is filled in between the protrusions.

18. The display device of claim 17, wherein the first inorganic layer is directly on the base portion between the protrusions.

19. The display device of claim 16, wherein the light emitting areas are adjacent to each other in a first direction and a second direction substantially perpendicular to the first direction, and each of the protrusions overlaps the non-light-emitting area between the light emitting areas.

20. The display device of claim 16, wherein each of the protrusions is spaced apart from the light emitting areas adjacent thereto in a plan view.

* * * * *